(12) United States Patent
Lee et al.

(10) Patent No.: US 7,935,554 B2
(45) Date of Patent: May 3, 2011

(54) SEMICONDUCTOR LIGHT EMITTING DEVICE AND METHOD OF MANUFACTURING THE SAME

(75) Inventors: Jeong-wook Lee, Yongin-si (KR); Youn-joon Sung, Yongin-si (KR); Ho-sun Paek, Yongin-si (KR); Hyun-soo Kim, Yongin-si (KR); Joo-sung Kim, Yongin-si (KR); Suk-ho Yoon, Yongin-si (KR)

(73) Assignee: Samsung LED Co., Ltd., Suwon, Gyunggi-do (KR)

( * ) Notice: Subject to any disclaimer, the term of this patent is extended or adjusted under 35 U.S.C. 154(b) by 0 days.

(21) Appl. No.: 12/407,361

(22) Filed: Mar. 19, 2009

(65) Prior Publication Data

US 2009/0181484 A1   Jul. 16, 2009

Related U.S. Application Data

(60) Division of application No. 11/705,736, filed on Feb. 14, 2007, now abandoned, which is a continuation-in-part of application No. 11/293,273, filed on Dec. 5, 2005.

(30) Foreign Application Priority Data

Dec. 8, 2004   (KR) .................. 10-2004-0103112
Feb. 14, 2006  (KR) .................. 10-2006-0014241

(51) Int. Cl.
    *H01L 21/302*   (2006.01)
(52) U.S. Cl. ............. 438/42; 438/22; 438/44; 438/689; 257/E21.228; 257/E21.219

(58) Field of Classification Search .............. 438/42, 438/22, 44, 689; 257/E21.22, E21.219
See application file for complete search history.

(56) References Cited

U.S. PATENT DOCUMENTS

| | | | |
|---|---|---|---|
| 6,657,236 B1 | 12/2003 | Thibeault et al. | |
| 6,777,871 B2 * | 8/2004 | Duggal et al. ............. | 313/506 |
| 6,781,160 B1 * | 8/2004 | Tsai et al. ............. | 257/98 |
| 6,809,342 B2 | 10/2004 | Harada et al. | |
| 7,187,007 B2 | 3/2007 | Kim et al. | |
| 7,317,212 B2 | 1/2008 | Shin | |

(Continued)

FOREIGN PATENT DOCUMENTS

EP   1111689   6/2001

(Continued)

OTHER PUBLICATIONS

Chinese Office Action dated Jul. 11, 2008 and English translation.

(Continued)

*Primary Examiner* — Ngan Ngo
*Assistant Examiner* — Benjamin Tzu-Hung Liu
(74) *Attorney, Agent, or Firm* — Buchanan Ingersoll & Rooney PC

(57) ABSTRACT

Provided are a semiconductor light emitting device having a nano pattern and a method of manufacturing the semiconductor light emitting device. The semiconductor light emitting device includes: a semiconductor layer comprising a plurality of nano patterns, wherein the plurality of nano patterns are formed inside the semiconductor layer; and an active layer formed on the semiconductor layer. The optical output efficiency is increased and inner defects of the semiconductor light emitting device are reduced.

5 Claims, 7 Drawing Sheets

U.S. PATENT DOCUMENTS

| | | | |
|---|---|---|---|
| 2002/0070449 A1 | 6/2002 | Yagi et al. | |
| 2002/0080463 A1 | 6/2002 | Tonar et al. | |
| 2002/0139990 A1 | 10/2002 | Suehiro et al. | |
| 2002/0190263 A1* | 12/2002 | Hata et al. | 257/103 |
| 2003/0020087 A1 | 1/2003 | Goto et al. | |
| 2003/0160256 A1 | 8/2003 | Durocher et al. | |
| 2003/0178702 A1* | 9/2003 | Sawaki et al. | 257/622 |
| 2003/0209714 A1 | 11/2003 | Taskar et al. | |
| 2004/0067648 A1* | 4/2004 | Morita et al. | 438/689 |
| 2004/0142503 A1 | 7/2004 | Lee et al. | |
| 2004/0178415 A1 | 9/2004 | Hsu et al. | |
| 2004/0189184 A1 | 9/2004 | Yasuda | |
| 2005/0023967 A1* | 2/2005 | Gotoh et al. | 313/504 |
| 2005/0040407 A1 | 2/2005 | Kohda | |
| 2005/0082562 A1 | 4/2005 | Ou et al. | |
| 2005/0110123 A1 | 5/2005 | Waitl et al. | |
| 2005/0139846 A1 | 6/2005 | Park et al. | |
| 2005/0145873 A1* | 7/2005 | Pan et al. | 257/103 |
| 2006/0118800 A1 | 6/2006 | Kim | |
| 2006/0198162 A1 | 9/2006 | Ishidu et al. | |
| 2006/0220050 A1 | 10/2006 | Higaki et al. | |
| 2006/0278880 A1 | 12/2006 | Lee et al. | |
| 2007/0018181 A1 | 1/2007 | Steen et al. | |

FOREIGN PATENT DOCUMENTS

| | | |
|---|---|---|
| EP | 1429396 A1 | 6/2004 |
| JP | 2004-335740 A | 11/2004 |
| KR | 2005-0037324 | 4/2005 |
| KR | 2005-0079279 A | 8/2005 |
| KR | 2005-87584 A | 8/2005 |
| KR | 2005-96509 A | 10/2005 |
| KR | 2006-0004314 A | 1/2006 |
| WO | WO 2004/057682 A1 | 7/2004 |
| WO | WO 2005/020338 A1 | 3/2005 |

OTHER PUBLICATIONS

Office Action dated Apr. 21, 2008 from the Korean Intellectual Property Office.

Korean Office Action dated Apr. 21, 2008 (re: Korean application No. 2006-12915) and English translation.

European Search Report dated Nov. 7, 2008.

Hao et al., "GaN films and GaN-based light emitting diodes grown on the sapphire substrates with high-density nano-craters formed in situ metalorganic vapor phase epitaxial reactor," Physica Status Solidi, Sep. 7, 2004, pp. 2397-2400, © 1, No. 10, Wiley-VCH Verlag GmbH & Co. KGaA, Weinheim, Germany.

Office Action in CN 200710005377.6 dated Jul. 31, 2009, and an English Translation thereof.

Office Action issued in Korean Patent Application No. 10-2004-0101653, Apr. 23, 2008, KIPO, KR, and English translation thereof.

Office Action dated Dec. 31, 2010 in corresponding Chinese Patent Application No. 200710005377.6, and translation thereof.

\* cited by examiner

SEMICONDUCTOR LIGHT EMITTING DEVICE AND METHOD OF MANUFACTURING THE SAME

CROSS-REFERENCE TO RELATED PATENT APPLICATION

Priority is claimed to U.S. patent application Ser. No. 11/293,273, filed on Dec. 5, 2005, in the U.S.P.T.O and of Korean Patent Application Nos. 10-2004-0103112 and 10-2006-0014241, filed on Dec. 8, 2004 and Feb. 14, 2006, respectively, in the Korean Intellectual Property Office, the disclosures of which are incorporated herein in their entirety by reference.

BACKGROUND OF THE DISCLOSURE

1. Field of the Disclosure

The present disclosure relates to a semiconductor light emitting device, and more particularly, to a semiconductor light emitting device having a nano pattern for improving the optical efficiency and a method of manufacturing the same.

2. Description of the Related Art

A light emitting diode (LED) is a device used for emitting signals converted from electric energy to light such as an infrared ray or visible ray using the characteristics of a compound semiconductor. The LED is a type of electroluminescent (EL) device, and these days, Group III-V compound semiconductor LEDs are largely utilized.

A Group III nitride compound semiconductor is a direct transition type semiconductor that can operate stably at higher temperatures than devices using other types of semiconductors, and is used widely in light emitting devices such as LEDs or laser diodes (LDs). Such Group III nitride compound semiconductors are usually formed on a sapphire ($Al_2O_3$) substrate. Research is being conducted on various types of LEDs in order to increase the light emitting efficiency, that is, the optical output efficiency. For example, research is being conducted on forming an uneven structure in an optical output region of a LED to increase the optical output efficiency.

At interfaces of material layers having different refractive indices, optical propagation is limited according to the refractive index of each material layer. When light proceeds from a semiconductor layer having a great refractive index n=2.5 to an air layer having a small refractive index n=1 on a planar interface, light should be incident on the planar interface at a predetermined angle or smaller with respect to a vertical direction of the interface. When light is incident at a predetermined angle or greater, light is totally internally reflected on the planar interface and the optical output efficiency is greatly decreased. Thus, in order to prevent this decrease in the optical output efficiency, attempts have been tried to introduce an uneven structure at the interface.

FIG. 1 is a schematic view illustrating a conventional semiconductor light emitting device including an uneven structure.

Referring to FIG. 1, an n-GaN layer 112 is formed on a sapphire substrate 111, and an n-AlGaN layer 113, an active layer 114, a p-AlGaN layer 115, a p-GaN layer 116, and a p-electrode 117 are sequentially formed on a portion of the n-GaN layer 112. Then an n-electrode 118 is formed in a portion of the n-GaN layer 112 where the n-AlGaN layer 113 is not formed. The above-described structure outputs light generated in the active layer 114 in a flip-chip form mainly to the transmissive sapphire substrate 111. An uneven structure 120 is formed on the surface of the sapphire substrate 111 to increase the optical output efficiency. The uneven structure 120 is used for increasing the optical output efficiency. However, when the sapphire substrate 111 is patterned to form the uneven structure 120, particularly as illustrated in FIG. 1, the crystal structure of the sapphire substrate 111 and the semiconductor layer formed on the sapphire substrate 111 do not match each other and thus defects are likely to be generated in the semiconductor layer. Thus it is difficult to grow a uniform semiconductor layer. Accordingly, the optical efficiency is decreased due to inner crystal defects.

SUMMARY OF THE DISCLOSURE

The present disclosure provides a semiconductor light emitting device and a method of manufacturing the semiconductor light emitting device for increasing the optical output efficiency and reducing inner crystal defects in the semiconductor light emitting device.

According to an aspect of the present disclosure, there is provided a semiconductor light emitting comprising: a semiconductor layer comprising a plurality of nano patterns, wherein the plurality of nano patterns are formed inside the semiconductor layer; and an active layer formed on the semiconductor layer.

The semiconductor layer may comprise: a first semiconductor layer wherein the plurality of nano patterns are formed; and a second semiconductor layer formed on a region of the first semiconductor layer where the plurality of nano patterns are formed.

The first and the second semiconductor layers may contain GaN.

The semiconductor light emitting device may further comprise a third semiconductor layer formed on the active layer.

Each of the plurality of nano patterns may be formed of a light-transmissive material having a refractive index smaller than 2.5.

Each of the plurality of nano patterns may be a transparent insulator and contain at least one of $SiO_2$, $SiN_x$, $Al_2O_3$, HfO, $TiO_2$ or ZrO.

Each of the plurality of nano patterns may be a transparent conductor formed of ZnO or of an In oxide containing at least one additive selected from the group consisting of Ag, Zn, Sc, Hf, Zr, Te, Se, Ta, W, Nb, Cu, Si, Ni, Co, Mo, Cr, Mn, Hg, Pr, and La.

The semiconductor layer may be formed on a substrate of sapphire.

The semiconductor light emitting device may further comprise: a first electrode formed on the third semiconductor layer; and a second electrode formed on a portion of the second semiconductor layer where the active layer is not formed.

According to another aspect of the present disclosure, there is provided a method of manufacturing a semiconductor light emitting device having a nano pattern, the method comprising: (a) forming a first semiconductor layer on a substrate; (b) forming an uneven structure by patterning the first semiconductor layer; (c) forming a nano pattern by filling the pattern of the first semiconductor layer with light-transmissive material; and (d) sequentially forming a second semiconductor layer, an active layer, and a third semiconductor layer on the first semiconductor layer.

Operation (b) of the method may comprise etching using $H_3PO_4$ or KOH.

Operation (c) of the method may comprise: coating a light-transmissive material over the exposed substrate and the uneven structure of the first semiconductor layer; and leveling the first semiconductor layer such that a surface of the first semiconductor layer is exposed.

The method may further comprise heating after the coating with the light-transmissive material.
disclosure

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

Figure 1:
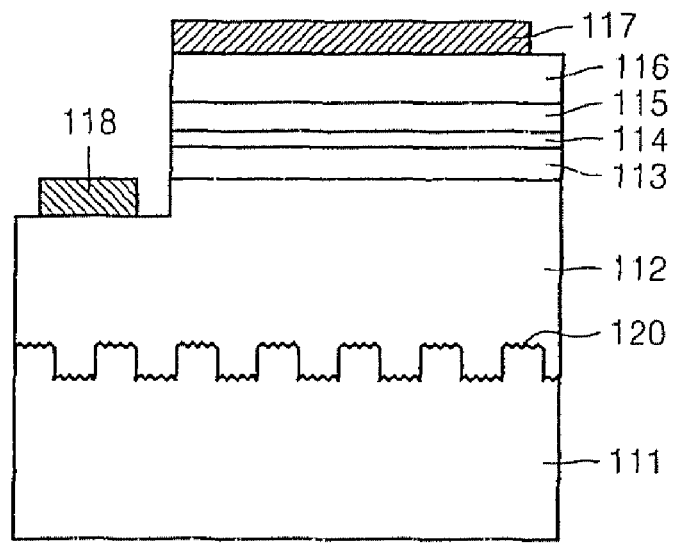
FIG. 1 illustrates a conventional semiconductor light emitting device including an uneven structure.

The present disclosure will now be described more fully with reference to the accompanying drawings, in which exemplary embodiments of the disclosure are shown. In the drawings, the thicknesses of layers are exaggerated for clarity.

Figure 2:
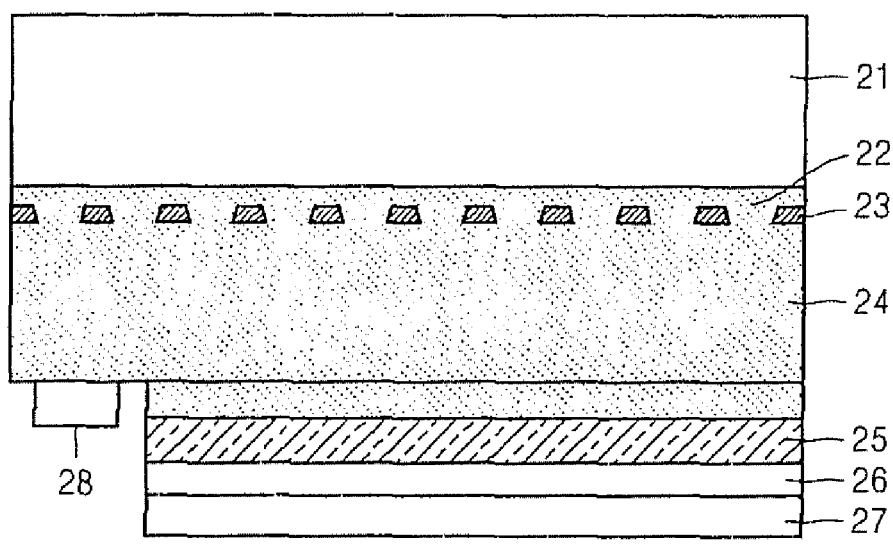
FIGS. 2 and 3 illustrate a semiconductor light emitting device having a nano pattern according to embodiments of the present disclosure.
Figure 3:
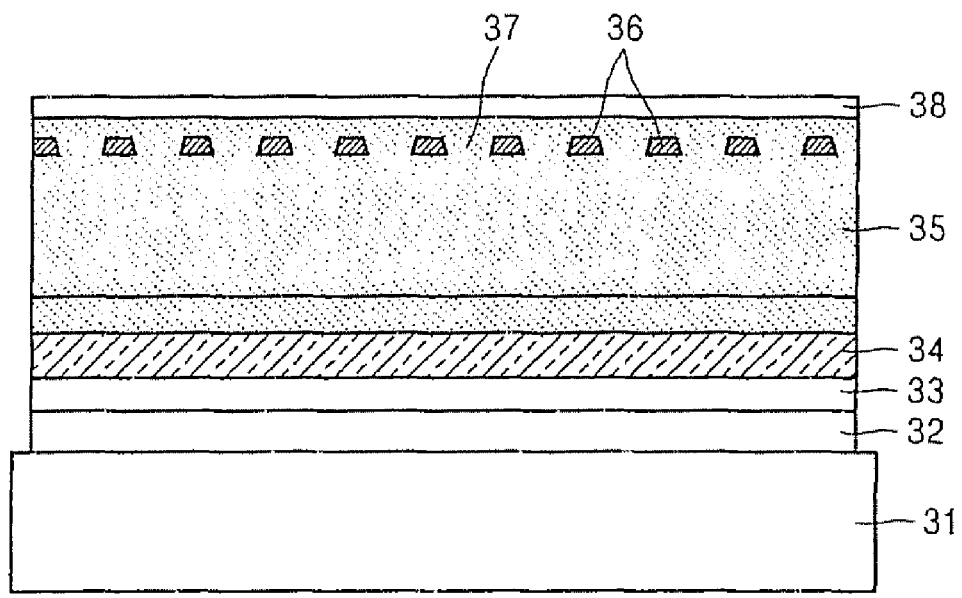

FIGS. 2 and 3 illustrate semiconductor light emitting devices having a nano pattern according to embodiments of the present disclosure. FIG. 2 illustrates a flip chip type semiconductor light emitting device, and FIG. 3 illustrates a vertical type semiconductor light emitting device.

Referring to FIG. 2, a first semiconductor layer 22 is formed on a first surface of a substrate 21, and nano patterns 23 are formed inside the first semiconductor layer 22. A second semiconductor layer 24 is formed on a surface of the first semiconductor layer 22 in which the nano patterns 23 are formed. An active layer 25, a third semiconductor layer 26, and a first electrode 27 are sequentially formed in a first region of the third semiconductor layer 26, and a second electrode 28 is formed in a second region of the second semiconductor layer 24.

The substrate 21 may be formed of sapphire ($Al_2O_3$), which is generally used, or may be GaN, ZnO, SiC, Si or GaO substrate, and the first and second semiconductor layers 22 and 24 may be formed of p-GaN, for example. The nano pattern 23 may be of a transparent insulator or a transparent conductor having a refractive index of 2.5 or smaller. For example, the transparent insulator may be formed of $SiO_2$, $SiN_x$, $Al_2O_3$, HfO, $TiO_2$ or ZrO. The transparent conductor may be formed of ZnO or an In oxide containing at least one material selected from the group consisting of Mg, Ag, Zn, Sc, Hf, Zr, Te, Se, Ta, W, Nb, Cu, Si, Ni, Co, Mo, Cr, Mn, Hg, Pr, and La. However, the present disclosure is not limited to the above examples. The size (width or length) of the nano pattern 23 may be from several nanometers to several micrometers, which can be adjusted according to need.

The active layer 25 may be formed of a material that is usually used in a semiconductor light emitting device or a laser emitting device, and in a multiple layer structure having a multiple quantum wall structure for instance. The third semiconductor layer 26 may be formed of n-GaN, the first electrode 27 may be formed of a n-type conductive material, the second electrode 28 may be formed of an p-type conductive material, but other combinations of p- and n-type materials can be used.

As illustrated in FIG. 2, the nano patterns 23 formed in the first semiconductor layer 22 are not spaced apart from each other regularly, and the interval between the nano patterns 23 may be determined by defects inside the first semiconductor layer 22, particularly, by screw dislocation. This will be explained in more detail with respect to manufacturing processes to be described later. According to the current embodiment of the present disclosure, the nano pattern 23 is formed in the defect region of the first semiconductor layer 22 and the second semiconductor layer 24 is formed thereon to reduce the inner defect of the semiconductor light emitting device and to increase the external optical output efficiency of the light generated in the active layer 25. The nano patterns 23 create an interface between the semiconductor material of the semiconductor layer formed by the first and second semiconductor layers 22 and 24 and the material of the nano patterns 23 having multiple angles relative to light emitted by the active layer 25, thereby reducing the total internal reflection because the light becomes more scattered thereby increasing its chance of exiting the semiconductor light emitting device, and thereby increasing the light output of the device. In other words, the nano patterns 23 have an optical scattering effect.

FIG. 3 illustrates a vertical type semiconductor light emitting device. Referring to FIG. 3, a first electrode 32, a third semiconductor layer 33, an active layer 34, and a second semiconductor layer 35 are sequentially formed on a lower structure 31. A first semiconductor layer 37 including a nano pattern 36 is formed on the second semiconductor layer 35. A second electrode 38 is formed on the first semiconductor layer 37.

The materials used for each layer of the vertical type semiconductor light emitting device illustrated in FIG. 3 are as follows. The first and second semiconductor layers 37 and 35 may be formed of n-GaN. The nano pattern 36 may be formed of a transparent insulator or a transparent conductor having a refractive index of 2.5 or smaller. For example, the transparent insulator may be formed of $SiO_2$, $SiN_x$, $Al_2O_3$, HfO, $TiO_2$ or ZrO. The transparent conductor may be formed of ZnO or an In oxide containing at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La. The active layer 34 may be formed of a material that is usually used in a semiconductor light emitting device or a laser emitting device, and may be of a multiple layer structure having a multiple quantum wall structure. The third semiconductor layer 33 may be formed of p-GaN, and the first electrode 32 may be formed of a p-type conductive material and the second electrode 38 may be formed of an n-type conductive material.

The nano patterns 36 are not spaced apart from each other regularly, and the interval between the nano patterns 36 may be determined by defects inside the first semiconductor layer 37, particularly, by screw dislocation. According to the current embodiment of the present disclosure, the nano pattern 36 is formed in the defect region of the first semiconductor layer 37 and the second semiconductor layer 35 is formed thereon to reduce the inner defect of the semiconductor light emitting device and to increase the external optical output efficiency of the light generated in the active layer 33.

Hereinafter, a method of manufacturing a semiconductor light emitting device having a nano pattern according to an embodiment of the present disclosure will be described in more detail with reference to attached drawings. FIGS. 4A through 4E illustrates operations of the method of manufacturing the semiconductor light emitting device having a nano pattern according to an embodiment of the present disclosure. A method of forming a nano pattern will be described in more detail.

Figure 4A:
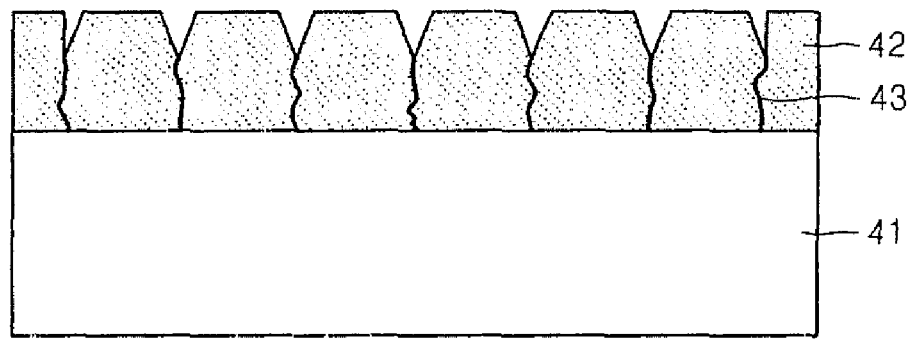
FIGS. 4A through 4E illustrate operations of a method of manufacturing a semiconductor light emitting device having a nano pattern according to an embodiment of the present disclosure.

Referring to FIG. 4A, a first semiconductor layer 42 is formed on a substrate 41. The substrate 41 may be a sapphire substrate (refractive index n=1.78), and the first semiconductor layer 42 may be formed of n-GaN.

Figure 4B:
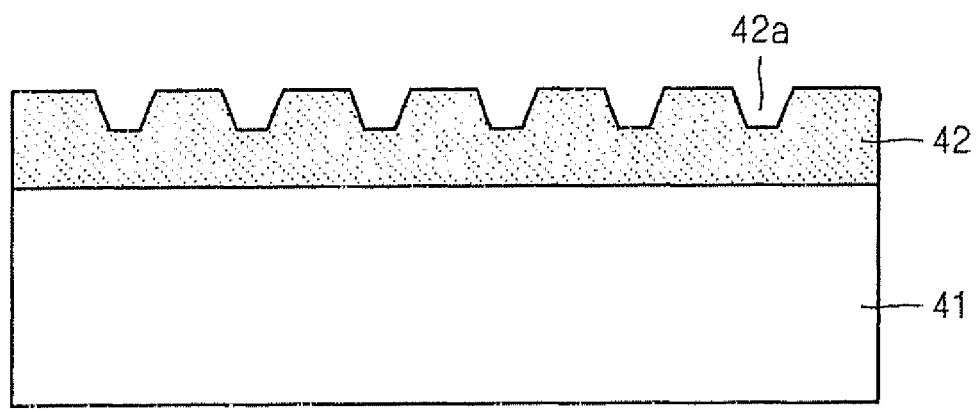
Figure 5A:
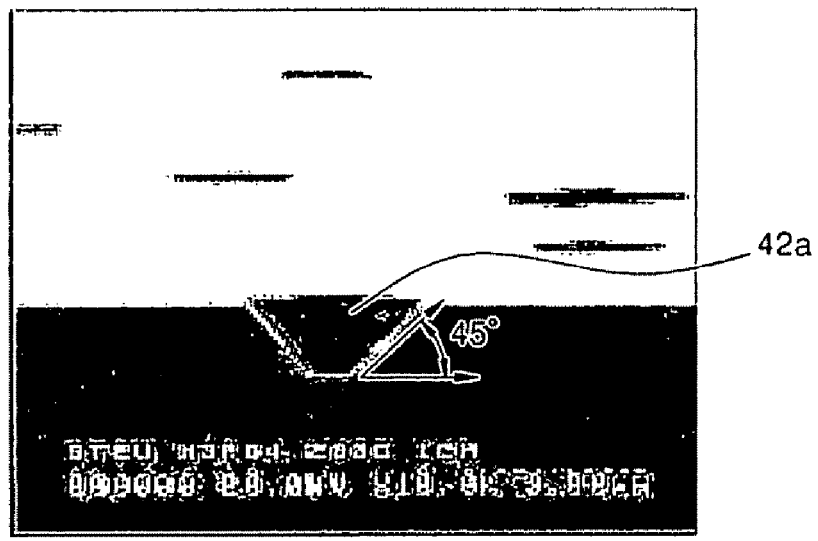
FIGS. 5A and 5B are photographic images showing a semiconductor light emitting device having a nano pattern according to an embodiment of the present disclosure during operations of the manufacturing.

Referring to FIG. 4B, a surface of the first semiconductor layer 42 is etched using $H_3PO_4$ or KOH. Since the crystal structures of a sapphire material and of GaN are different from each other in general, crystal defects may occur in each material. For example, inner defects 43 such as screw dislocation may be formed into the surface of the first semiconductor layer 42 from the substrate 41. When the surface of the first semiconductor layer 42 is wet-etched using $H_3PO_4$, etching is mainly performed in the region of crystal defects 43, thereby forming an etch pit. Here, the etching direction is not only downwards according to the direction of the crystal defects 43 but also sideways. FIG. 5A is a photographic image showing the first semiconductor layer 42 when the first semiconductor layer 42 is wet-etched using $H_3PO_4$. When the first semiconductor layer 42 is etched using KOH, the etching direction is the direction of the substrate 41. Accordingly, during an etching process, the width and length of the etching pattern can be controlled selectively. The shape of an etching pattern 42a has a trapezoid uneven cross-section, and the interval between the etching patterns 42a is generally affected by the crystal defects 43 formed in the first semiconductor layer 42.

Figure 4C:
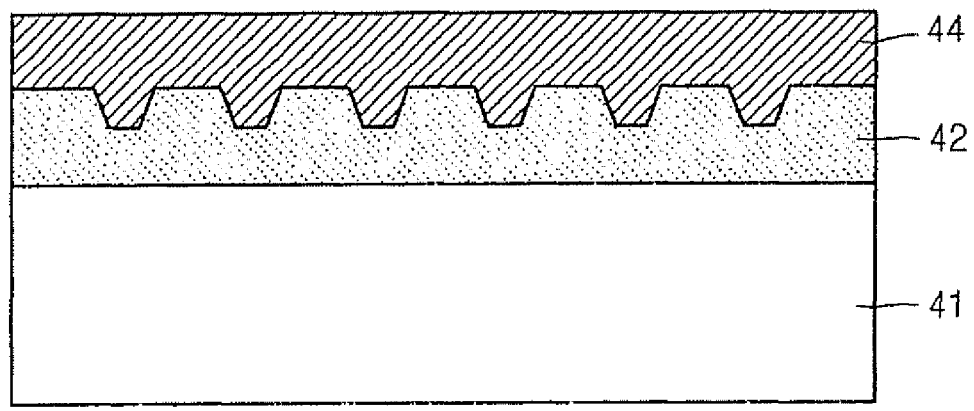

Referring to FIG. 4C, a material of a nano pattern 44 is coated on the first semiconductor layer 42 that is patterned in an uneven structure on a substrate 41. The nano pattern 44 may be formed of a highly light-transmissive material because light generated in the active layer is output through the uneven structure. In detail, the nano pattern 44 may be formed of a transparent insulator or a transparent conductor having a refractive index of 2.5 or smaller. The transparent insulator may be $SiO_2$, $SiN_x$, $Al_2O_3$, HfO, $TiO_2$ or ZrO. The transparent conductor may be ZnO or an In oxide containing at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La. These materials have a refractive index of about 1.4 through 1.8 in general. The material of the nano pattern 44 may be coated on the first semiconductor layer, and then annealed additionally. For example, the annealing may be carried out under an $H_2$ atmosphere of MOCVD at 1100° C. for about 1 hour.

Figure 4D:
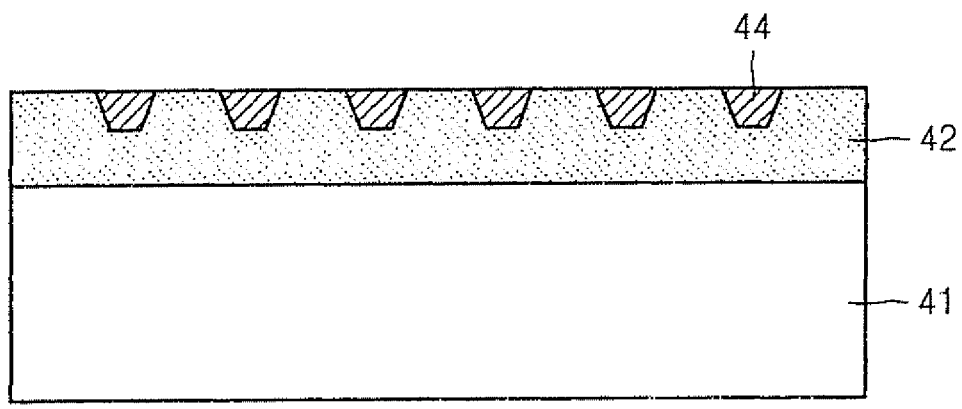

Referring to FIG. 4D, leveling is performed to expose an upper portion of the first semiconductor layer 42 which is coated with the material of the nano pattern 44. Thus the nano patterns 44 are formed between the exposed portions of the first semiconductor layer 42. The size of the nano patterns 44 can be controlled to be from several tens to several hundreds of nanometers or greater by controlling the etching process as described before.

Figure 4E:
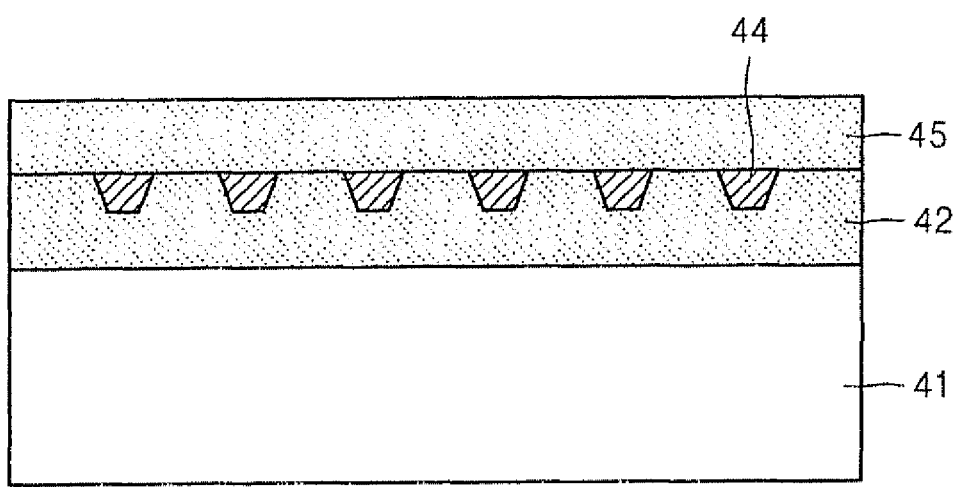
Figure 5B:
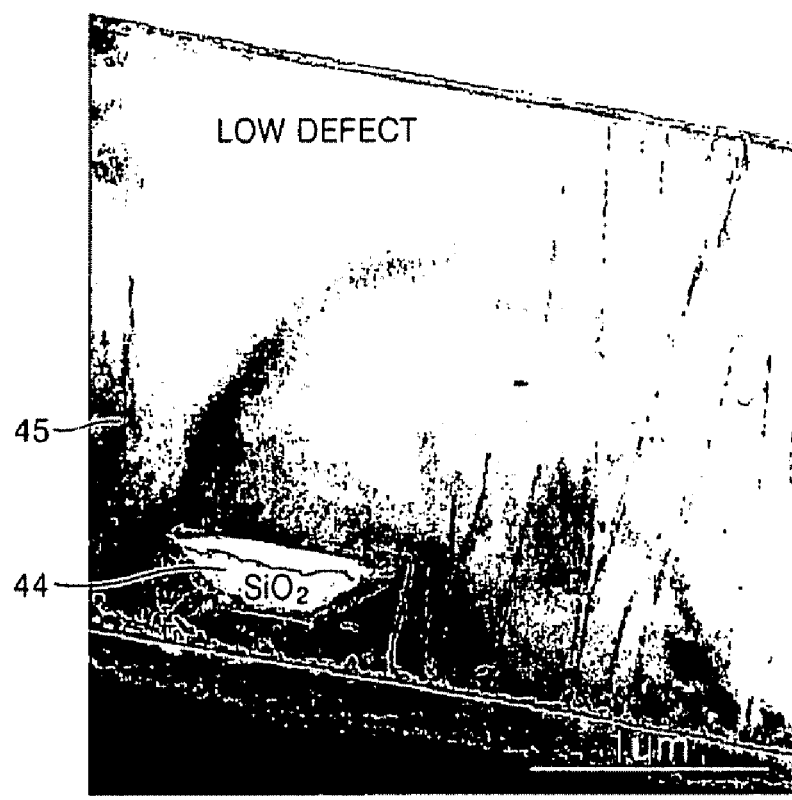

Referring to FIG. 4E, a second semiconductor layer 45 is formed on the exposed first semiconductor layer 42 and the nano pattern 44. The second semiconductor layer 45 may be formed of the same material as the first semiconductor layer 42, for example, of n-GaN. In this case, the second semiconductor layer 45 is grown on the first semiconductor layer 42 which has relatively few crystal defects, and thus crystal defects are greatly reduced compared to a case where the second semiconductor layer is formed directly on the surface of the sapphire substrate 41. FIG. 5B illustrates the nano pattern 44 formed of $SiO_2$ and the second semiconductor layer 45 formed thereon. FIG. 5B shows that crystal defects are significantly reduced on the nano pattern 44.

Consequently, according to the operations shown in FIGS. 4A through 4E, the nano pattern 44 can be formed at the boundary region of the first semiconductor layer 42 and the second semiconductor layer 45. The active layer or the third semiconductor layer formed on the second semiconductor layer 45 can be easily formed using conventional manufacturing processes. The semiconductor light emitting device having a nano pattern formed in the above-described manner can be used as a flip-chip type, or as a vertical type by removing the substrate 41 and further forming an electrode.

Figure 6A:
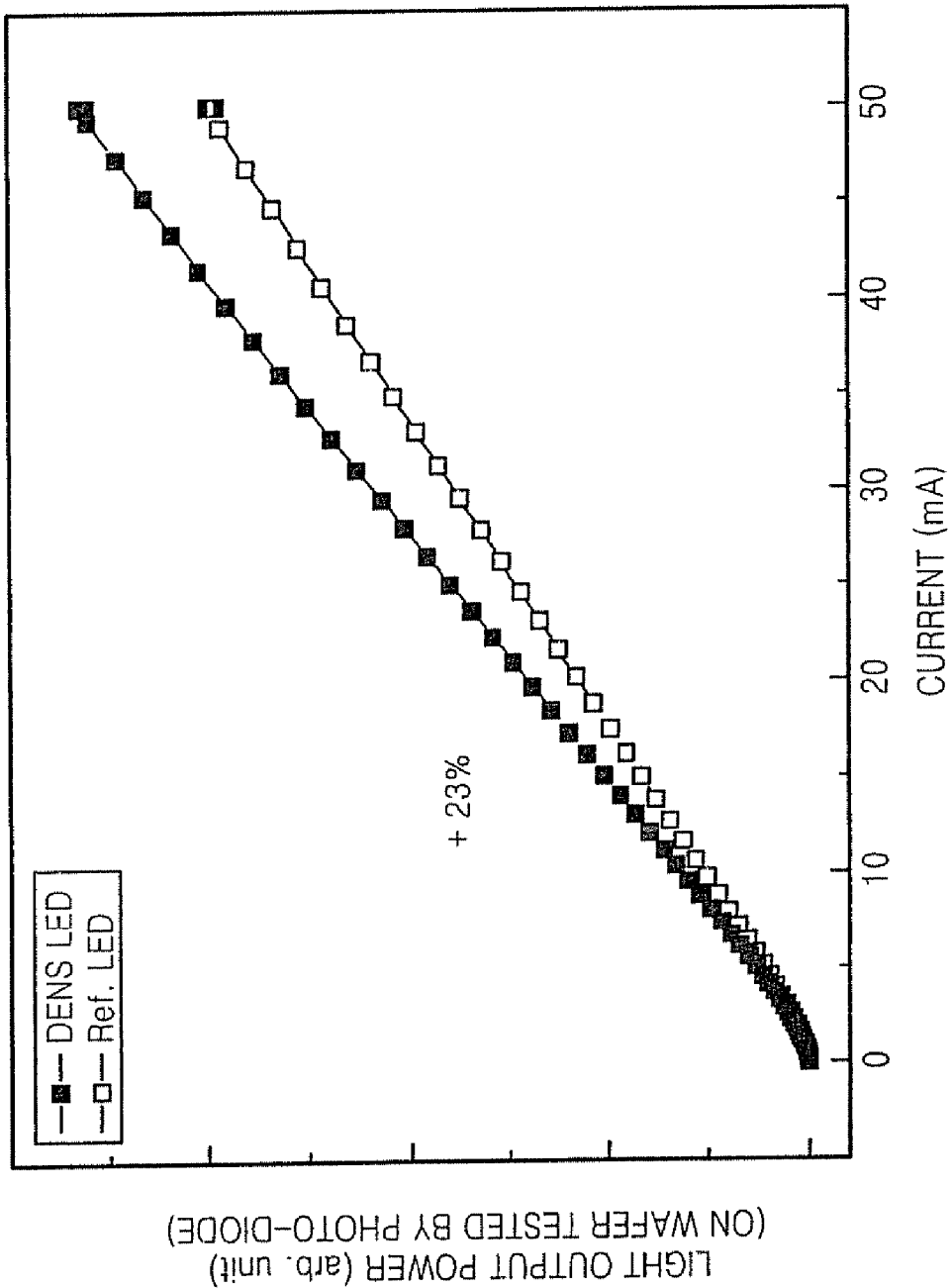
FIGS. 6A and 6B are graphs showing light emitting characteristics of a semiconductor light emitting device according to an embodiment of the present disclosure and a conventional semiconductor light emitting device.
Figure 6B:
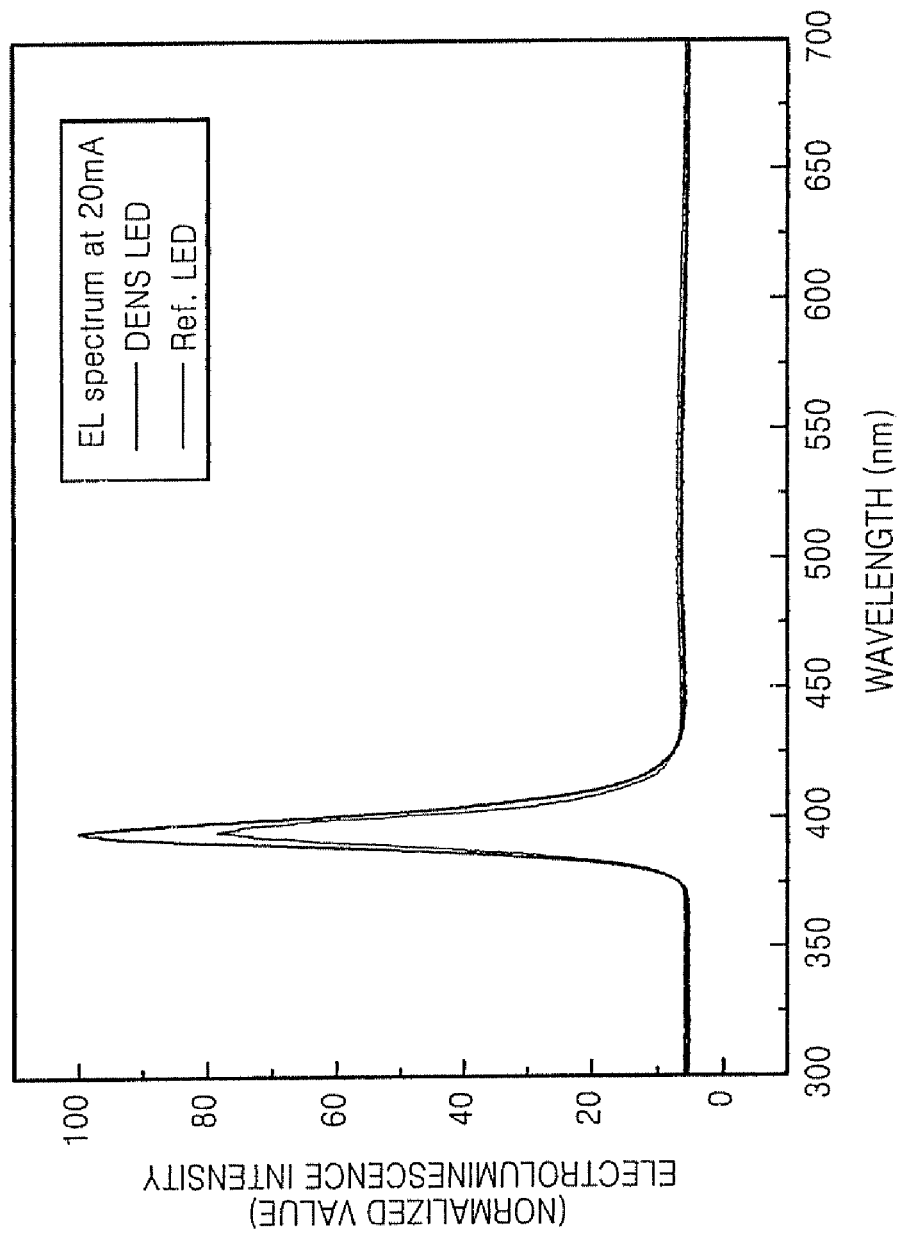

FIGS. 6A and 6B are graphs showing the light emitting characteristics of a semiconductor light emitting device having a nano pattern according to an embodiment of the present disclosure and a conventional semiconductor light emitting device.

In detail, FIG. 6A shows the amount of emitted light emitting according to an applied current, that is, the optical output amount. In the case of the semiconductor light emitting device having a nano pattern according to the current embodiment of the present disclosure (dielectric embedded nitride structure (DENS), n=1.4), the amount of emitted light is 23% higher than in the case the semiconductor light emitting device having a conventional planar structure (Ref. LED).

FIG. 6B is a graph showing optical density (electroluminescent intensity) according to each wavelength of light. As shown in FIG. 6B, the semiconductor light emitting device having a nano pattern according to the current embodiment of the present disclosure has significantly increased optical intensity than the conventional semiconductor light emitting device at an output optical wavelength of about 396 nm.

According to the present disclosure, inner defects that are likely to occur during the manufacturing processes of a semiconductor light emitting device can be greatly reduced and the optical output efficiency of light generated in the active layer can be greatly increased by inserting a nano pattern into a semiconductor layer of the semiconductor light emitting device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor light emitting device having a nano pattern, the method comprising:
   (a) forming a first semiconductor layer on a substrate;
   (b) forming etch pits in defect regions of the first semiconductor layer by wet-etching an upper surface of the first semiconductor;
   (c) forming a nano pattern by filling the etch pits of the first semiconductor layer with light-transmissive material; and
   sequentially forming a second semiconductor layer, an active layer, and a third semiconductor layer on the first semiconductor layer,
   wherein step (c) comprises:

coating a light-transmissive material over the first semiconductor layer to fill the etch pits; and leveling the first semiconductor layer such that a surface of the first semiconductor layer is exposed and the exposed surface of the first semiconductor layer is coplanar with the filled light transmissive material.

2. The method of claim 1, wherein (b) comprises etching using $H_3PO_4$ or KOH.

3. The method of claim 1, wherein the light-transmissive material is a transparent insulator and is formed of at least one selected from the group consisting of $SiO_2$, $SiN_x$, $Al_2O_3$, HfO, $TiO_2$, and ZrO.

4. The method of claim 1, wherein the light-transmissive material is a transparent conductor and is formed of ZnO or of an In oxide containing at least one additive selected from the group consisting of Mg, Ag, Zn, Sc, Hf, Zr, Te, Se, Ta, W, Nb, Cu, Si, Ni, Co, Mo, Cr, Mn, Hg, Pr, and La.

5. The method of claim 1, further comprising heating after the coating with the light-transmissive material.

* * * * *